(12) United States Patent
Chen et al.

(10) Patent No.: US 7,866,364 B2
(45) Date of Patent: Jan. 11, 2011

(54) FABRICATION TOOL FOR BONDING

(75) Inventors: Chien-Hua Chen, Corvallis, OR (US); Troy D. Schwinabart, Corvallis, OR (US); William M. Atkinson, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1293 days.

(21) Appl. No.: 11/413,333

(22) Filed: Apr. 28, 2006

(65) Prior Publication Data

US 2007/0274669 A1  Nov. 29, 2007

(51) Int. Cl.
 *G02B 6/00* (2006.01)
(52) U.S. Cl. .................................. 156/581; 156/358
(58) Field of Classification Search .................. 156/358, 156/580, 581, 583.3; 100/295
 See application file for complete search history.

(56) References Cited

U.S. PATENT DOCUMENTS

| | | | | |
|---|---|---|---|---|
| 3,868,291 | A | * | 2/1975 | Benz et al. ................... 156/515 |
| 5,074,944 | A | * | 12/1991 | Trenka ........................ 156/219 |
| 5,273,553 | A | | 12/1993 | Hoshi et al. |
| 5,324,384 | A | * | 6/1994 | Spengler ..................... 156/581 |
| 5,567,661 | A | | 10/1996 | Nishio et al. |
| 5,711,845 | A | * | 1/1998 | Ozawa et al. ............ 156/477.1 |
| 6,521,857 | B1 | | 2/2003 | Barnett |
| 6,521,858 | B1 | | 2/2003 | Barnett |
| 6,756,560 | B2 | | 6/2004 | Barnett |
| 6,908,832 | B2 | | 6/2005 | Farrens et al. |
| 2003/0174383 | A1 | | 9/2003 | Bolle et al. |
| 2004/0109124 | A1 | | 6/2004 | Masuda |
| 2004/0112518 | A1 | | 6/2004 | Rossier et al. |

FOREIGN PATENT DOCUMENTS

| | | |
|---|---|---|
| CN | 1 648 032 A | 8/2005 |
| DE | 102 56 059 A1 | 6/2004 |
| JP | 62 071215 A | 4/1987 |
| JP | 11 192712 A | 7/1999 |
| JP | 2005-011649 A | 1/2005 |
| WO | 2005/054147 A | 6/2005 |

\* cited by examiner

*Primary Examiner*—John L Goff
*Assistant Examiner*—Daniel McNally

(57) ABSTRACT

A fabrication tool presses a first device surface against a second device surface after the first and the second device surfaces have been plasma activated, to bond the first device surface with the second device surface. The fabrication tool includes a bonding piston to exert force on the first device surface to press the first device surface against the second device surface. The fabrication tool also includes a pressure plate situated between the bonding piston and the first device surface. The fabrication tool further includes a mechanism to ensure that the force exerted by the bonding piston on the first device surface via the pressure plate is initially exerted at one or more first locations on the first device surface and subsequently exerted at one or more second locations on the first device surface.

10 Claims, 7 Drawing Sheets

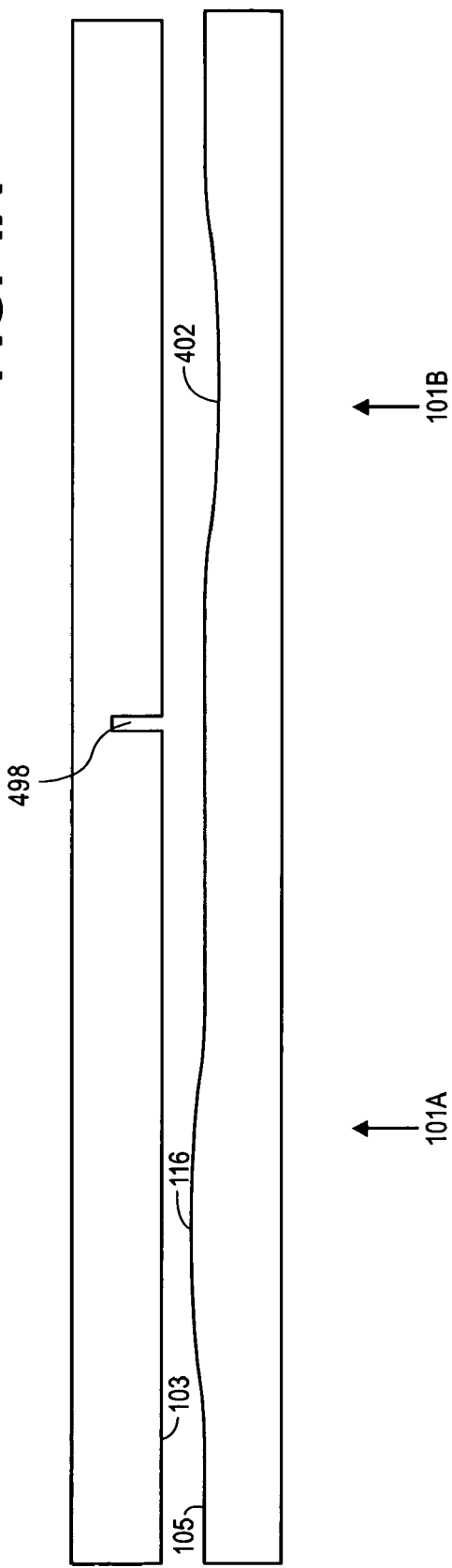

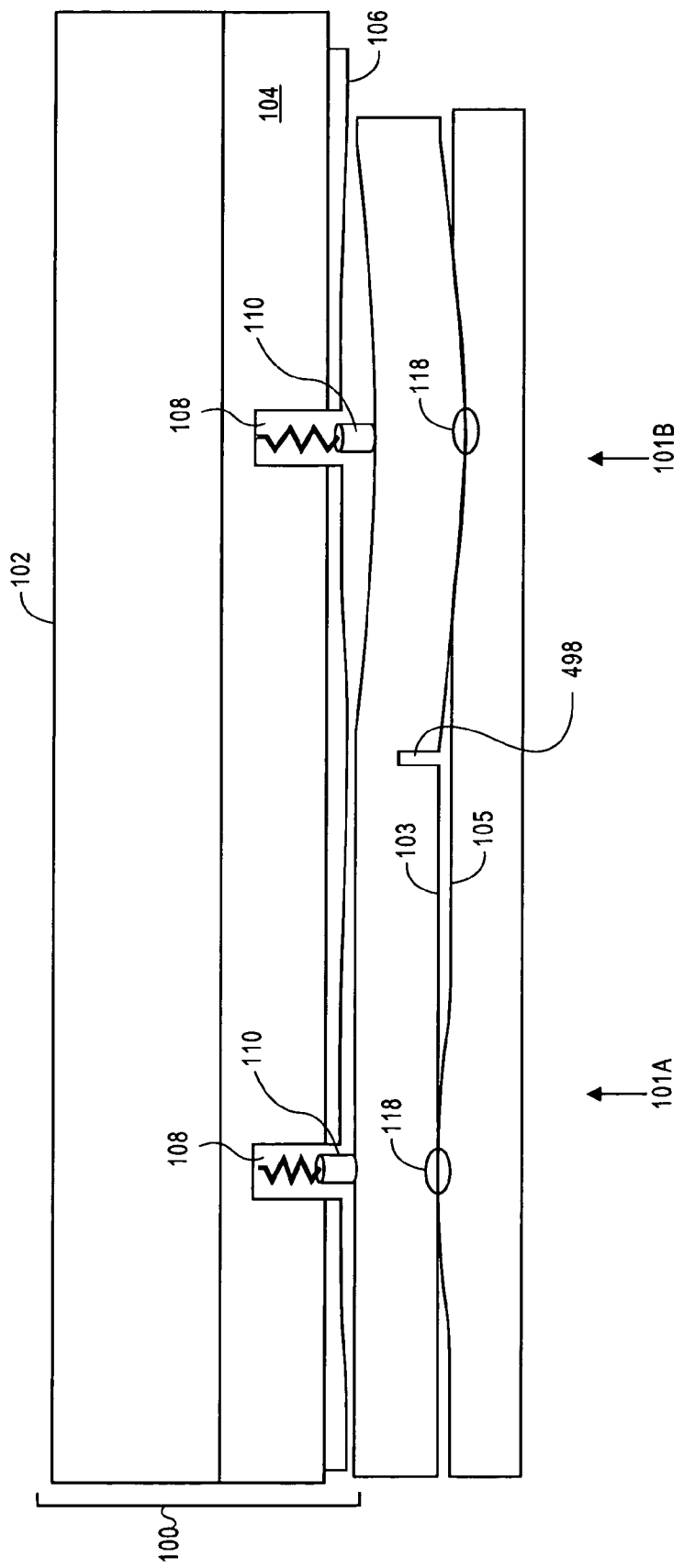

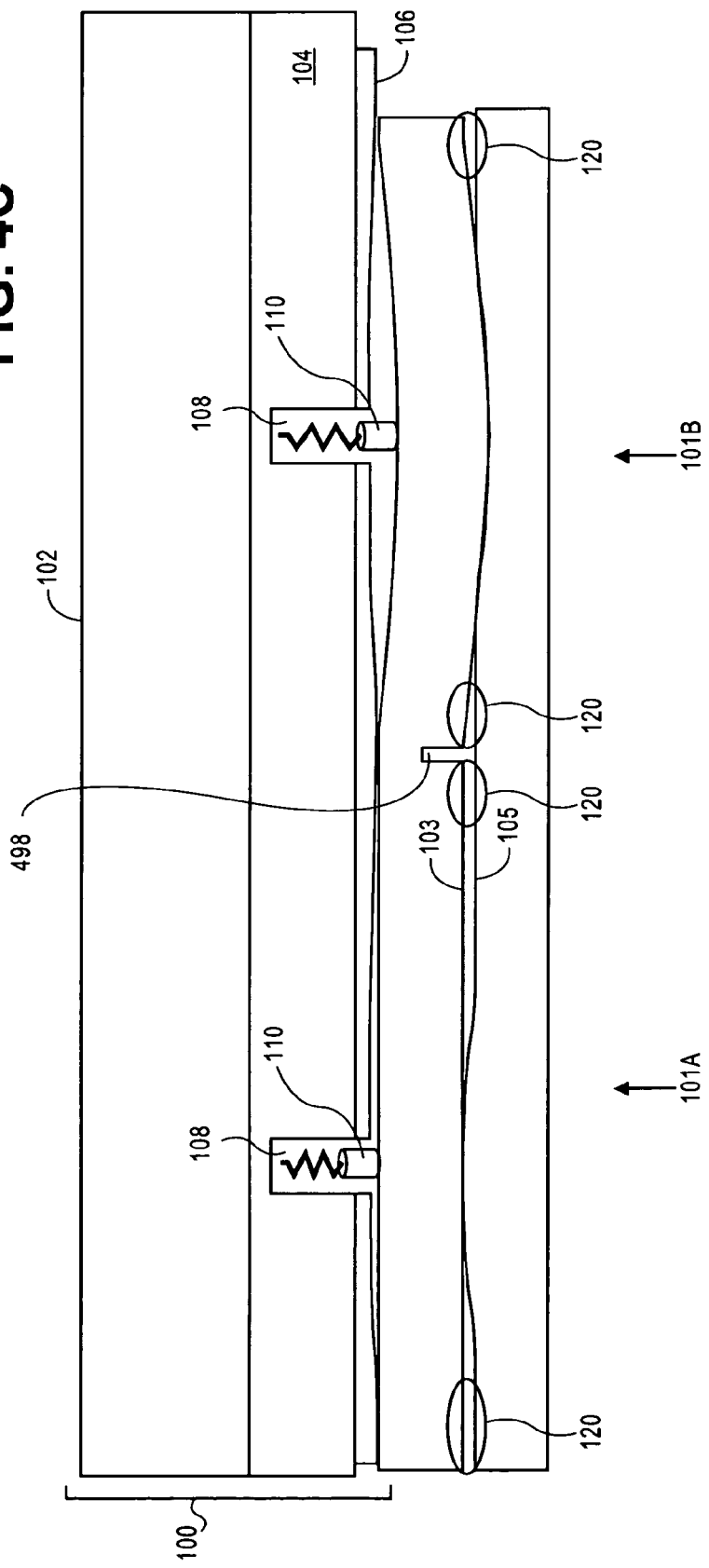

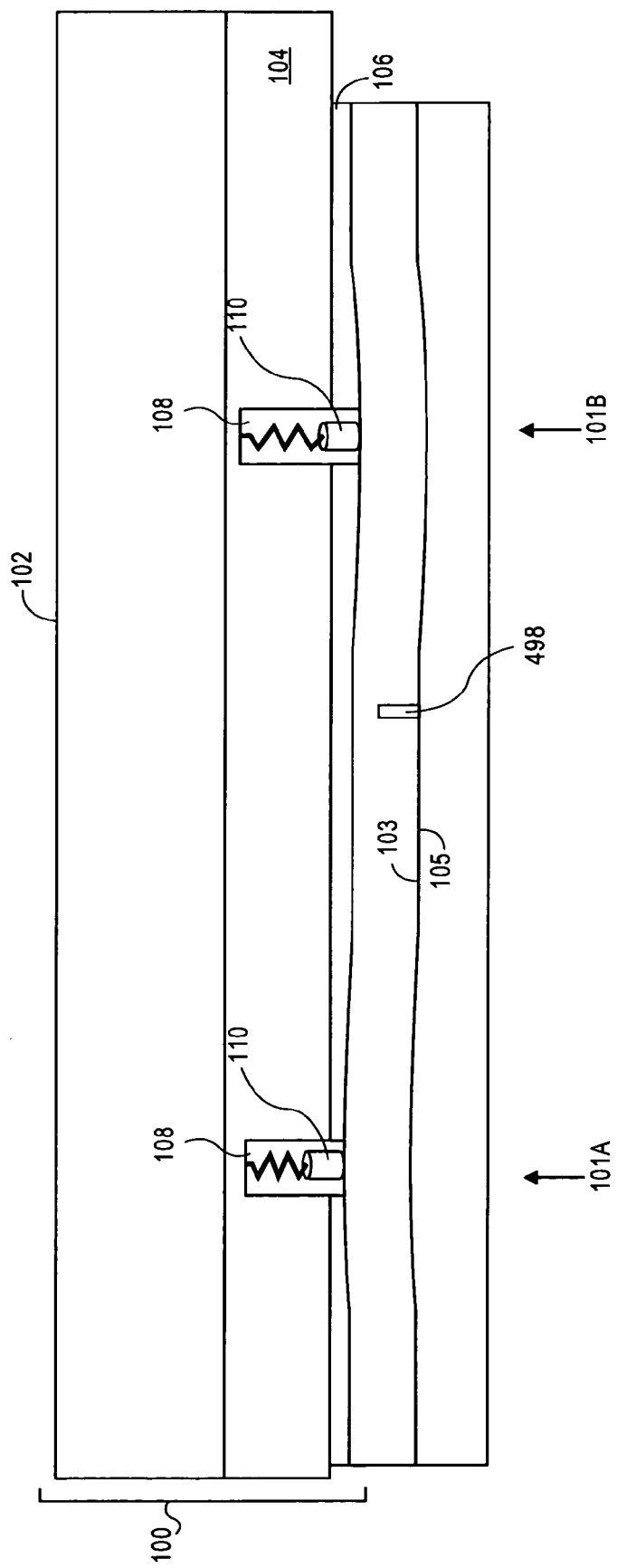

FABRICATION TOOL FOR BONDING

BACKGROUND

Plasma bonding is a common way to bond together two surfaces of a device. The surfaces are typically polished or otherwise made smooth, and then plasma activated. Plasma activation of the surfaces causes the surfaces to be more receptive to permanent bonding once the surfaces are pressed together. Thus, after smoothing and plasma activation of the surfaces, the surfaces are pressed together to permanently bond them.

Within the prior art, the surfaces of the device being bonded together are presumed to be planar. Therefore, they are pressed together by a force that is substantially uniform across the surfaces. However, when one or more of the surfaces are non-planar, such pressing together with substantially uniform force can be problematic. Air may be trapped in crevices and other non-uniformities within the surfaces. Ultimately, for this and other reasons, a good bond may not result.

BRIEF DESCRIPTION OF THE DRAWINGS

FIGS. 4A, 4B, 4C, and 4D are diagrams depicting exemplary performance of the method of FIG. 3, according to varying embodiments of the invention.

DETAILED DESCRIPTION

Figure 1A:
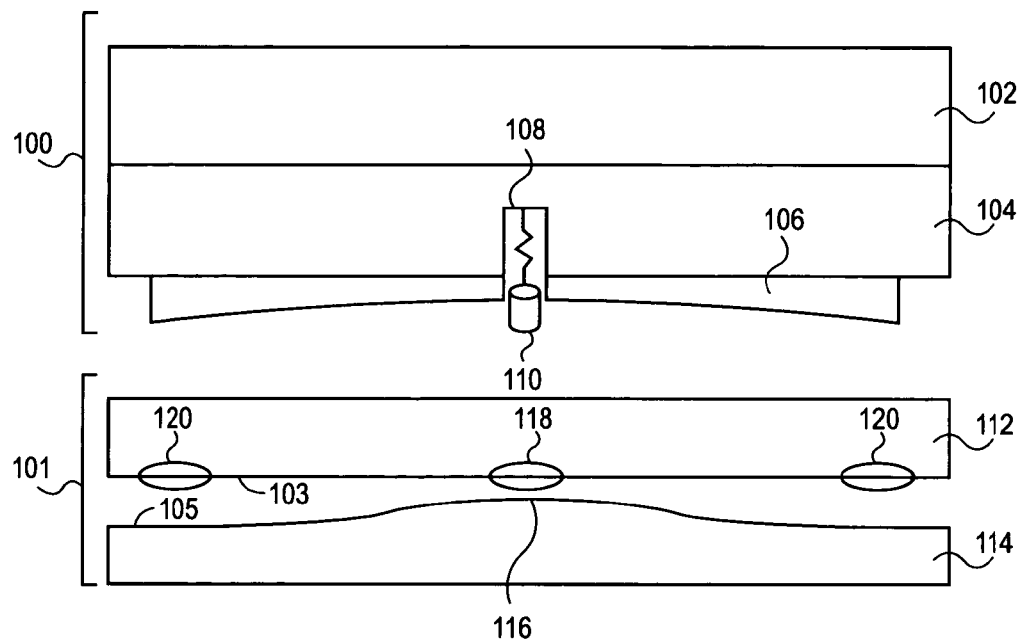
FIGS. 1A and 1B are cross-sectional diagrams of a fabrication tool to press a first device surface against a second device surface, according to varying embodiments of the invention.
Figure 1B:
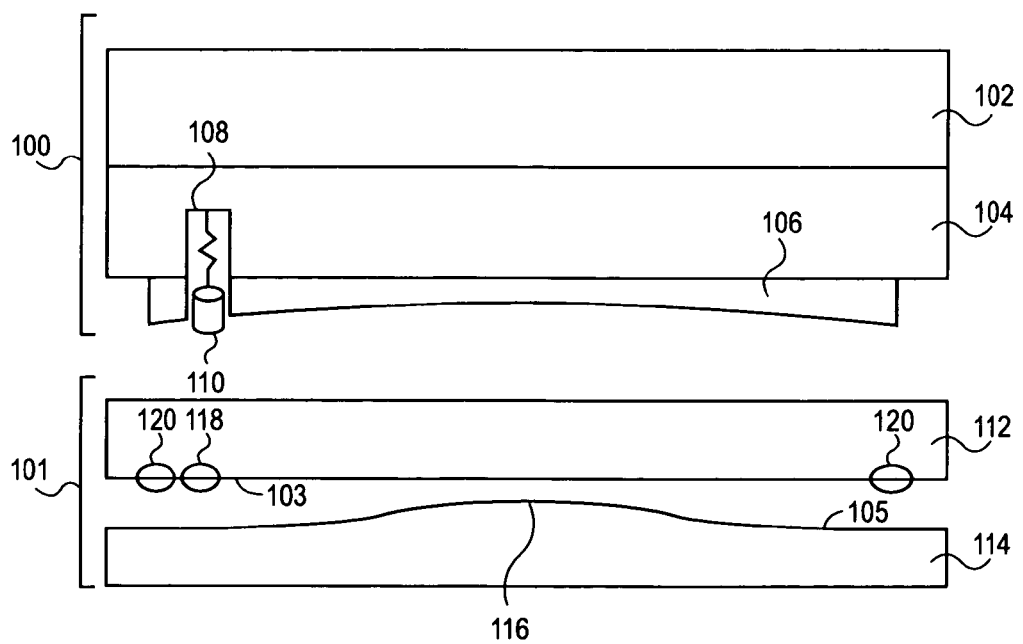

FIGS. 1A and 1B cross-sectionally show a fabrication tool 100 to press a device surface 103 against a device surface 105 to form an electronic device 101, according to different embodiments of the invention. The electronic device 101 being formed may be a micro-electromechanical (MEM) device, an optical device, a semiconductor device, and/or another type of electronic device. The device 101 includes a component 112 of which the device surface 103 is a part, and a component 114 of which the device surface 105 is a part. Thus, the combination of the components 112 and 114, upon being bonded together, forms at least a portion of the electronic device 101.

In one embodiment, the electronic device 101 is a display MEM device, for use in display devices. The component 112 may be transparent, such as a glass substrate. The component 114 may include the micro-electromechanical elements that enable the electronic device 101 to be a display MEM device.

Prior to utilization of the fabrication tool 100 to press the device surface 103 against the device surface 105, the surfaces 103 and 105 may have been prepared. For instance, they may have first been polished to smooth the surfaces 103 and 105. The surfaces 103 and 105 may then have been plasma activated so that upon pressing the device surface 103 against the device surface 105, a strong and permanent bond results.

At least one of the device surfaces 103 and 105 is non-planar. In FIGS. 1A and 1B, the device surface 103 is planar, but the device surface 105 is non-planar. More particularly, the device surface 105 includes a surface portion 116 that is convex. Alternatively, the surface portion 116 may be concave. The device surface 105 and/or the device surface 103 may be non-planar in another way as well.

The fabrication tool 100 includes a bonding piston 102, a pressure plate 104, a profiled insert 106, and a spring-loaded pushing element 110. The bonding piston 102 is the component of the fabrication tool 100 that actually exerts force, as can be appreciated by those of ordinary skill within the art. The pressure plate 104 is situated between the bonding piston 102 and the component 112 having the device surface 103.

The profiled insert 106 is situated between the pressure plate 104 and the component 112 having the device surface 103. The profiled insert 106 is profiled in FIGS. 1A and 1B in that it tapers at a angle away from the edges of the device surfaces 103 and 105 towards the center of the device surfaces 103 and 105. The profiled insert 106 may alternatively be profiled in a different way. The profiled insert 106 may be fabricated from a compliant material, such as Kapton, Viton, Delron, or another compliant material, so that a uniform force is applied to the component 112 when full force is exerted by the spring-loaded pushing element 110. The profiled insert 106 will thus deform to some extent under a full force load.

The spring-loaded pushing element 110 is affixed to the pressure plate 104 and is movable through a hole 108 within the pressure plate 104 and the profiled insert 106. The pushing element 110 may also be referred to as a bow pin, and may include a spring ending in a flat or rounded cylinder, as is shown in FIGS. 1A and 1B. The pushing element 110, by virtue of its constituent spring, is normally extended beyond the lowest point(s) of the profiled insert 106. In FIG. 1A, the pushing element 110 is located within the center of the fabrication tool 100, whereas in FIG. 1B, the pushing element 110 is located near an edge of the fabrication tool 100.

As will be described in more detail later, upon exertion of force by the bonding piston 102, the pressure plate 104, the profiled insert 106, and the pushing element 110 move downward towards the component 112. The pushing element 110 makes first contact with the component 112. As a result, the force exerted by the bonding piston 102 (via or through the pressure plate 104) is first, or initially, exerted at a corresponding location 118 of the device surface 103 underneath the pushing element 110.

As the bonding piston 102, the pressure plate 104, the profiled insert 106, and the pushing element 110 continue to move downward, second contact may be made by the edges of the profiled insert 106. This is because these edges of the profiled insert 106 are lower than other portions of the profiled insert 106. In any case, the force exerted by the bonding piston 102 (via or through the pressure plate 104) is second, or subsequently, exerted at corresponding locations 120 of the device surface 103 underneath the edges of the profiled insert 106.

As the bonding piston 102, the pressure plate 104, the profiled insert 106, and the pushing element 110 continue to move downward, ultimately contact is made by the entire surface of the profiled insert 106. Thus, the force exerted by the bonding piston 102 (via or through the pressure plate 104) is ultimately exerted substantially over the entirety of the device surface 103 underneath the profiled insert 106. Due to the great force exerted by the bonding piston 102, the shape of the device surface 103 may at least substantially correspond to the mirror image of the device surface 105. Furthermore, the shape of the top surface of the component 112 may at least substantially correspond to the shape of the profiled insert 106 and the spring-loaded pushing element 110. This is also described in more detail later.

The profiled insert 106 and the spring-loaded pushing element 110 can together be considered a mechanism that ensures that the force exerted by the bonding piston 102 ultimately on the device surface 103 is first exerted at the location 118, is second exerted at the locations 120, and then is finally exerted over the entirety of the device surface 103. Thus, the force exerted onto the device surface 103 is not uniform over time. Rather, the force is selectively exerted onto the device surface 103 first at the location 118, and then also at the locations 120, before finally being exerted over the entirety of the device surface 103.

In this respect, the fabrication tool 100 of FIGS. 1A and 1B provides for advantages over the prior art. Unlike in the prior art, where force is exerted onto a device surface uniformly over time, the non-uniform exertion of force over time provided by the fabrication tool 100 substantially prevents air from being trapped between the device surfaces 103 and 105. Furthermore, because bonding starts at the location 118 and continues at the locations 120 before occurring at all the locations of the device surface 103, the resultant bond between the device surfaces 103 and 105 may be stronger as compared to as if bonding starts over the entirety of the device surface 103.

Figure 2:
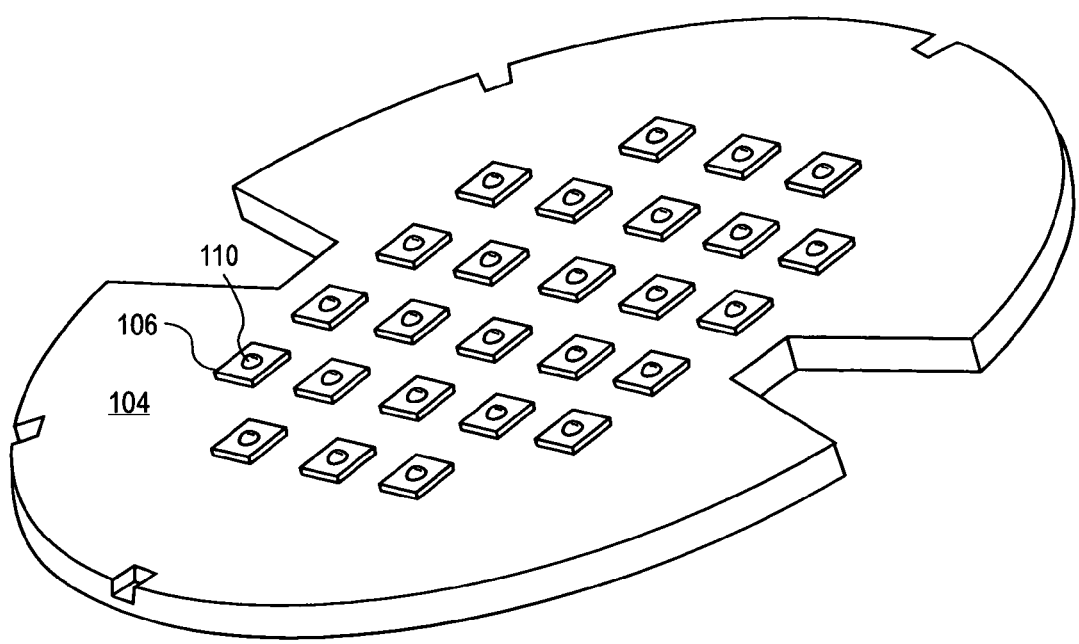
FIG. 2 is a perspective-view diagram of the bottom side of the pressure plate of the fabrication tool of FIGS. 1A and 1B, according to an embodiment of the invention.

FIG. 2 shows a perspective view of the underside of the pressure plate 104, according to an embodiment of the invention. The pressure plate 104 includes a number of instances of profiled inserts, such as the profiled insert 106, and a number of instances of spring-loaded pushing elements, such as the spring-loaded pushing element 106. The spring-loaded pushing elements are located in the example of FIG. 2 in the centers of their corresponding profiled inserts, as in FIG. 1A, as compared to as in FIG. 1B.

Each instance of a profiled insert and a corresponding spring-loaded pushing element corresponds to a single electronic device. Thus, the pressure plate 104 in FIG. 2 is intended to press together two wafers or other substrates having a large number of such electronic devices. Each profiled insert and corresponding pushing element pushes together a single instance of the electronic device.

Figure 3:
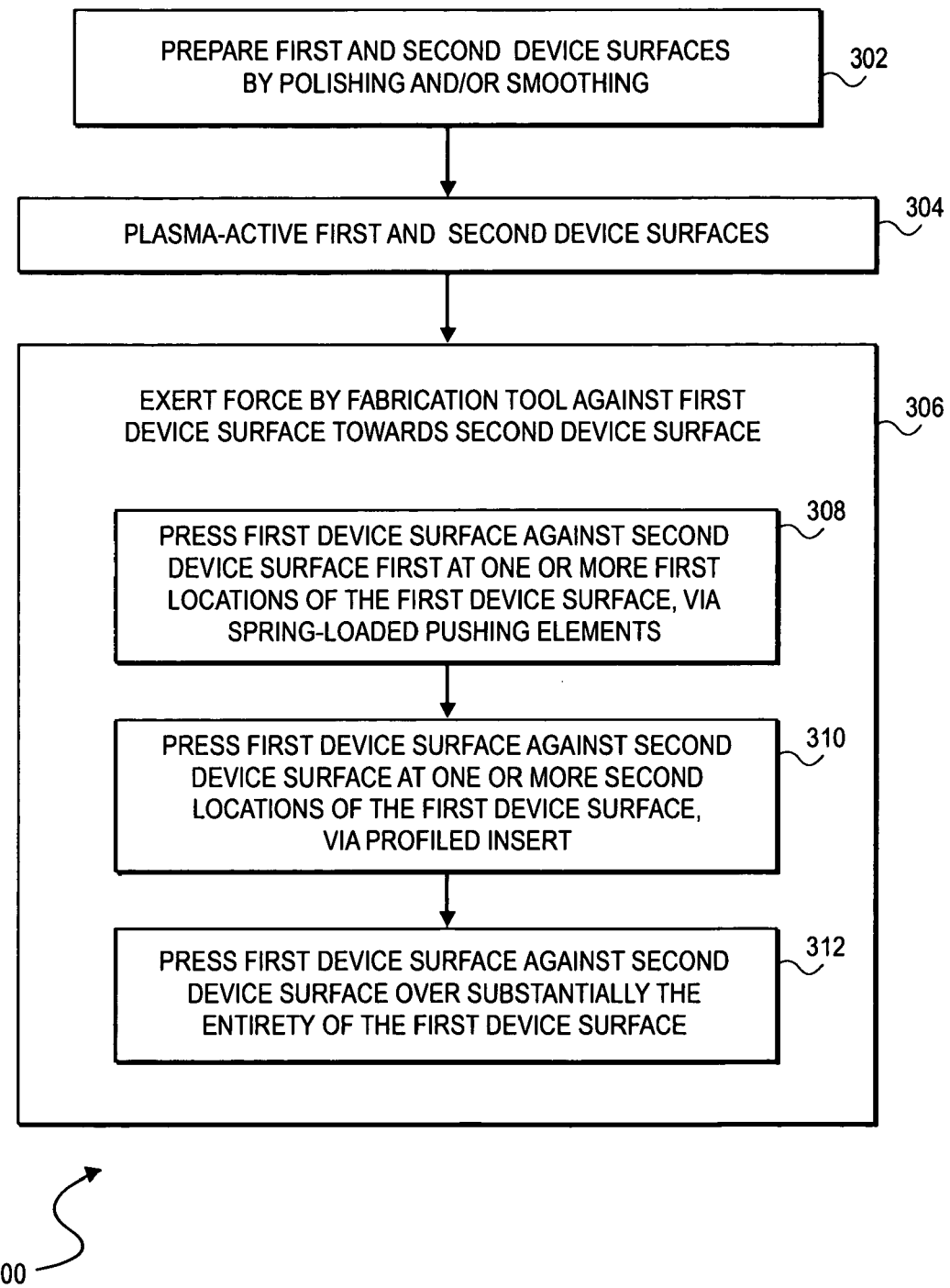
FIG. 3 is a flowchart of a method to at least partially fabricate an electronic device using the fabrication tool of FIG. 1A, according to an embodiment of the invention.

FIG. 3 shows a method 300 for fabricating the electronic device 101 using the fabrication tool 100, according to an embodiment of the invention. The device surfaces 103 and 105 of the electronic device 101 are first prepared by polishing and/or smoothing (302). Thereafter, the device surfaces 103 and 105 are plasma activated (304). For instance, the device surfaces 103 and 105 may be exposed within a plasma chamber to plasma, to ready the device surfaces 103 and 105 for ultimate bonding.

FIG. 4A shows an example of two representative electronic devices 101A and 101B after performance of the parts 302 and 304 of the method 300 of FIG. 3, according to an embodiment of the invention. The left portion of the device surfaces 103 and 105 corresponds to one electronic device 101A, and the right portion of the device surfaces 103 and 105 corresponds to another electronic device 101B. The device surfaces 103 and 105 have been polished and/or smoothed, and plasma activated. The device surface 103 of the electronic devices 101A and 101B is planar. The device surface 105 of the electronic device 101A has a surface portion 116 that is convex, whereas the device surface 105 of the electronic device 101B has a surface portion 402 that is concave. There is a gap 498 within the device surface 103, which is described in more detail later in the detailed description.

Referring back to FIG. 3, the method 300 continues by the fabrication tool 100 exerting force against the device surface 103 to press the device surface 103 towards and ultimately against the device surface 105 (306), to bond the device surfaces 103 and 105 of the electronic device 101 together. As has been described, the force is first exerted at one or more first locations 118 of the device surface 103, and is second exerted at one or more second locations 120 of the device surface 103. Thereafter, ultimately the force is exerted completely over the device surface 103.

Performance of the part 306 of the method 300 thus first includes pressing the device surface 103 against the device surface 105 at one or more first locations 118 of the device surface 103 (308). The bonding piston 102 of the fabrication tool 100 pushes downward, exerting a force through the pressure plate 104, where the spring-loaded pushing elements 110 make first contact between the fabrication tool 100 and the electronic device 101. As a result, the force exerted by the bonding piston 102 is first exerted at the locations 118 of the device surface 103 correspondingly underneath the spring-loaded pushing elements 110.

FIG. 4B shows example performance of the part 308 of the method 300 of FIG. 3, according to an embodiment of the invention, in relation to the electronic devices 101A and 101B of FIG. 4A. Because the spring-loaded pushing elements 110 normally extend outward from their holes 108, they make first contact with the electronic devices 101A and 101B. As a result, the force exerted by the bonding piston 102 through the pressure plate 104 and/or the profiled insert 106 is first exerted at the locations 118 of the device surface 103. With respect to the first device 101A, the device surface 103 retains its planar shape, since the left location 118 at which the force is initially exerted is against a highest, convex point of the device surface 105. With respect to the second device 101B, the device surface 103 begins to bend to conform to the shape of the device surface 105, since the right location 118 at which the force is initially exerted is against a lowest, concave point of the device surface 105.

Referring back to FIG. 3, performance of the part 306 of the method 300 next includes pressing the device surface 103 against the device surface 105 by exerting force at one or more second locations 120 of the device surface 103 (310). The bonding piston 102 of the fabrication tool 100 continues to push and move downward, exerting a force through the pressure plate 104 and to the profiled insert 106, such that the profiled insert 106 makes second contact between the fabrication tool 100 and the electronic device 101. The force exerted by the bonding piston 102 is exerted at the locations 120 of the device surface 103 correspondingly underneath the lowest points of the profiled insert 106, as has been described.

FIG. 4C shows example performance of the part 310 of the method 300 of FIG. 3, according to an embodiment of the invention, in relation to the electronic devices 101A and 101B of FIGS. 4A and 4B. The profiled nature of the profiled insert 106 result in the force exerted by the bonding piston 102 through the pressure plate 104 and to the profiled insert 106 being exerted next at the locations 120 of the device surface 103 that are underneath the lowest points of the profiled insert 106. In the example of FIG. 4C, these lowest points of the profiled insert 106 are the edges of the insert 106. The spring-loaded pushing elements 110 begin to recede into their holes 108, as a result of the continuing downward movement of the bonding piston 102, the pressure plate 104, and the profiled insert 106.

Referring back to FIG. 3, performance of the part 306 of the method 300 finally includes pressing the device surface 103 against the device surface 105 by exerting force over substantially the entirety of the device surface 103 (312). The bonding piston 102 of the fabrication tool 100 continues to push and move downward, exerting a force through the pressure plate 104 and to the profiled insert 106. The surface of the electronic device 101 incident to the profiled insert 106 may conform to the profile of the profiled insert 106, to provide for the force being exerted over at least substantially all of the device surface 103. The device surface 103 may further conform to the shape of the device surface 105, to provide for complete and securing bonding of the surfaces 103 and 105 together to result in at least partially the electronic device 101.

FIG. 4D shows example performance of the part 312 of the method 300 of FIG. 3, according to an embodiment of the invention, in relation to the electronic devices 101A and 101B of FIGS. 4A, 4B, and 4C. The force exerting by the bonding piston 102 through the pressure plate 104 and to the profiled insert 106 is exerted over substantially all of the device surface 103. The surfaces of the electronic devices 101A and 101B incident to the profiled insert 106 have taken on the mirror profile of the profiled insert 106. The device surface 103, by comparison, has taken on the mirror shape of the device surface 105. The spring-loaded pushing elements 110 have further receded into their holes 108, as a result of the continuing downward movement of the bonding piston 102, the pressure plate 104, and the profiled insert 106.

The bonding process described in relation to FIG. 3 as exemplarily depicted in relation to FIGS. 4A-4D is advantageous. The initial exertion of force at the locations 118 of the device surface 103 in FIG. 4B, followed by the subsequent exertion of force at the locations 120 of the surface 103 in FIG. 4C and the exertion of force over the entirety of the surface 103 in FIG. 4D substantially reduces the likelihood that air pockets will become trapped between the surfaces 103 and 105 during the bonding process. In one embodiment, the presence of the gap 498 alleviates the likelihood that air pockets will become trapped between the surfaces 103 and 105 during bonding. In particular, such air in this embodiment is pushed into the gap 498, such that it is not trapped between the surfaces 103 and 105 themselves.

Furthermore, the bonding process is such that the bond between the device surfaces 103 and 105 begins at one or more discrete points between the surfaces 103 and 105, at the locations 118, and then propagates to the remainder of the surfaces 103 and 105, at the locations 120, and then over all the locations. This can cause a stronger resulting plasma bond than if the bond were to start at all the locations between the device surfaces at the same time.

We claim:

1. A fabrication tool to press a first device surface against a second device surface, to bond the first device surface with the second device surface, the fabrication tool comprising:
   a bonding piston to exert force on the first device surface to press the first device surface against the second device surface; and,
   a pressure plate situated between the bonding piston and the first device surface; and,
   a mechanism to ensure that the force exerted by the bonding piston on the first device surface via the pressure plate is initially exerted at one or more first locations on the first device surface and subsequently exerted at one or more second locations on the first device surface,
   wherein the mechanism comprises:
      a profiled insert situated between the pressure plate and the first device surface, the profiled insert fabricated from a compliant material so as to deform under a full force load; and,
      one or more pushing elements attached to springs within the pressure plate and movable within corresponding holes of the pressure plate, such that under the full force load the pushing elements at least partially recede into the corresponding holes of the pressure plate,
   and wherein second contact is made with the first device surface at the second locations thereof by the profiled insert so that the force is subsequently exerted at the second locations thereof.

2. The fabrication tool of claim 1, wherein the pushing elements make first contact with the first device surface at the first locations thereof so that the force is initially exerted at the first locations thereof.

3. The fabrication tool of claim 1, wherein the first locations of the first device surface at which the force is initially exerted comprise substantially a middle of the first device surface.

4. The fabrication tool of claim 1, wherein the first locations of the first device surface at which the force is initially exerted comprise substantially one or more outside edges of the first device surface.

5. The fabrication tool of claim 1, wherein the second locations of the first device surface at which the force is initially exerted comprise substantially one or more outside edges of the first device surface.

6. A fabrication tool to press a first device surface against a second device surface, to bond the first device surface with the second device surface, the fabrication tool comprising:
   a bonding piston to exert force on the first device surface to press the first device surface against the second device surface; and,
   a pressure plate situated between the bonding piston and the first device surface; and,
   means for ensuring that the force exerted by the bonding piston on the first device surface via the pressure plate is initially exerted at one or more first locations on the first device surface and subsequently exerted at one or more second locations on the first device surface,
   wherein the means comprises:
      a profiled insert situated between the pressure plate and the first device surface, the profiled insert fabricated from a compliant material so as to deform under a full force load; and,
      one or more pushing elements attached to springs within the pressure plate and movable within corresponding holes of the pressure plate, such that under the full force load the pushing elements at least partially recede into the corresponding holes of the pressure plate,
   and wherein second contact is made with the first device surface at the second locations thereof by the profiled insert so that the force is subsequently exerted at the second locations thereof.

7. The fabrication tool of claim 6, wherein the pushing elements make first contact with the first device surface at the first locations thereof so that the force is initially exerted at the first locations thereof.

8. The fabrication tool of claim 6, wherein the first locations of the first device surface at which the force is initially exerted comprise substantially a middle of the first device surface.

9. The fabrication tool of claim 6, wherein the first locations of the first device surface at which the force is initially exerted comprise substantially one or more outside edges of the first device surface.

10. The fabrication tool of claim 6, wherein the second locations of the first device surface at which the force is initially exerted comprise substantially one or more outside edges of the first device surface.

* * * * *